United States Patent [19]

Lowrey et al.

[11] Patent Number: 5,057,449

[45] Date of Patent: Oct. 15, 1991

[54] PROCESS FOR CREATING TWO THICKNESSES OF GATE OXIDE WITHIN A DYNAMIC RANDOM ACCESS MEMORY

[75] Inventors: Tyler A. Lowrey; Fernando Gonzalez; Joseph J. Karniewicz, all of Boise, Id.

[73] Assignee: Micron Technology, Inc., Boise, Id.

[21] Appl. No.: 498,669

[22] Filed: Mar. 26, 1990

[51] Int. Cl.[5] .............................................. H01L 21/72
[52] U.S. Cl. .................................................... 437/60
[58] Field of Search ................ 437/52, 60, 919, 979, 437/69, 47; 148/DIG. 14, DIG. 163

[56] References Cited

U.S. PATENT DOCUMENTS

| | | | |
|---|---|---|---|
| 4,627,153 | 12/1986 | Masuoka | 437/52 |
| 4,651,406 | 3/1987 | Shimizu et al. | 437/52 |
| 4,675,982 | 6/1987 | Noble, Jr. et al. | 437/64 |
| 4,957,878 | 9/1990 | Lowrey et al. | 437/60 |

OTHER PUBLICATIONS

S. K. Ghandhi, VLSI Fabrication Priciples, pp. 576–582, 1983.

Primary Examiner—Brian E. Hearn
Assistant Examiner—C. Chaudhari
Attorney, Agent, or Firm—Angus C. Fox, III

[57] ABSTRACT

A process for creating two thicknesses or gate oxide within a dynamic random memory. The process begins by thermally growing a first layer of gate oxide on a silicon substrate. This first layer is then masked with photoresist in regions where cell access transistors will ultimately be fabricated. All oxide that is not masked is then removed with an oxide etch. After the photoresist is stripped, a second layer of gate oxide is thermally grown on the substrate. The resultant oxided layer, which comprises multiple-thickness components, is used as a pad oxide layer during a conventional LOCOS operation. Peripheral driver transistors are construction on top of a thin layer of gate oxide so as to optimize their performance, whereas, cell access transistors are constructed on top of a thicker layer of gate oxide so as to minimize row line capacitance. A net increase in row line access speed is thus obtained.

3 Claims, 9 Drawing Sheets

PROCESS FOR CREATING TWO THICKNESSES OF GATE OXIDE WITHIN A DYNAMIC RANDOM ACCESS MEMORY

FIELD OF THE INVENTION

This invention relates to semiconductor technology and, more specifically, to processes for creating transistors within dynamic random access memories, the gate oxide layer thickness of each transistor being optimized for its particular task.

BACKGROUND OF THE INVENTION

A DRAM array is comprised of individual memory cells constructed on a lightly-doped silicon substrate which are arranged by columns and rows. Each cell has a field-effect access transistor and a storage capacitor. The capacitor, which is directly connected to the transistor's source or storage node, may be charged and discharged through the transistor's channel. Transistor gates and gate interconnects within an array row are formed from a ribbon of conductive material which runs the length of the row. This conductive ribbon is known as a row line. Between consecutive transistor gates with a row, the row line traverses a field oxide region. In active areas of the array (locations where the row line functions as a gate), the row line is insulated from the substrate by a layer of gate oxide. When voltage is applied to each row line through a driver transistor, the transistors within the row are turned on. The access node of each transistor within an array column is interconnected with a bit line. In order to determine the capacitor charge value (which may be equated with either a "1" or a "0" binary value), a column sense amp at the end of the bit line compares the capacitor charge to a reference voltage.

The speed of a dynamic random access memory is dependent on a number of factors. One of the primary factors is access speed—the speed at which a row line can turn on the transistors of the cells along a row. Row line access speed is inversely proportional to the rowline's RC (resistance multiplied by capacitance) constant. In other words, an increase in either the resistance or the capacitance of the rowline will degrade access speed. The reduction of rowline resistance is easily achieved. In fact, current DRAM designs typically utilize rowlines constructed from conductively-doped polycrystalline silicon (hereinafter also "polysilicon" or "poly") that has been silicided with a refractory metal such as titanium, platinum, palladium, cobalt or tungsten. The resistance of a silicided, conductively-doped polysilicon is generally within the range of 15-20 ohms per square, whereas the resistance of titanium silicided conductively-doped polysilicon, for example, is approximately 2 ohms per square. However, the reduction of row line capacitance is more problematic. Row line capacitance is roughly equal to the summation of the poly gate-to-substrate capacitances, since the field oxide regions are relatively thick and capacitances of the word line over these regions is relatively minimal. Using current production techniques, all transistors within a DRAM array (whether they be cell access transistors or transistors within the periphery) utilize a single thickness of gate oxide. In order to reduce row line capacitance using current fabrication techniques, it would be necessary to increase the gate oxide layer thickness. Since capacitance is inversely proportional to dielectric layer thickness, a doubling of dielectric layer thickness should approximately halve row line capacitance. However, the drive current at maximum voltage for the peripheral, rowline driver transistors is decreased by the increase in dielectric layer thickness. Since a reduction in drive current will result in a reduction in rowline access speed, the gain in speed achieved through the reduction in row line capacitance has been offset by the reduction in speed caused by decreased drive current.

SUMMARY OF THE INVENTION

The present invention achieves a net increase in row line access speed by providing a process for creating DRAM memories having dual layers of gate oxide of different thicknesses. Peripheral driver transistors are constructed on top of a thin layer of gate oxide so as to optimize their performance, whereas, cell access transistors are constructed on top of a thicker layer of gate oxide so as to minimize row line capacitance.

The process begins by thermally growing a first layer of gate oxide on a silicon substrate. This first layer is then masked with photoresist in regions where cell access transistors will ultimately be fabricated. All oxide that is not masked is then removed with an oxide etch. After the photoresist is stripped, a second layer of gate oxide is thermally grown on the substrate. During the growth of the second gate oxide layer, the thickness of the remaining first oxide layer portions increases, but at a rate considerably slower than that at which new oxide initially forms on bare substrate regions. The resultant gate oxide layer, which then comprises regions of two different thicknesses, is used as a pad oxide layer during a conventional LOCOS operation; nitride is deposited on the resultant gate oxide layer, masked and etched to create regions devoid of nitride where field oxide regions will be grown. The field oxide regions are then thermally grown, and DRAM fabrication proceeds in a conventional manner.

PREFERRED EMBODIMENT OF THE INVENTION

The following process describes the fabrication of a small portion of a dynamic random access memory (DRAM) circuit. Two layers of gate oxide of different thicknesses will be created on a silicon substrate. A pair of cell access transistor gates will then be fabricated on the first and thicker gate oxide layer remnants, while a peripheral driver transistor will be fabricated on the second and thinner gate oxide layer. The process creates a dual-function, dual-thickness silicon dioxide layer that is used initially for a pad oxide layer during a local oxidation of silicon (LOCOS) step which creates field oxide regions. The same silicon dioxide layer is subsequently used for a gate oxide layer.

DRAM circuits are, of course, fabricated in masse on a wafer of silicon substrate. Although the creation of only two transistors is depicted in the following process summary, it should be remembered that millions of transistors are being simultaneously fabricated, not only on the same die (chip), but on the wafer as well.

Figure 1:
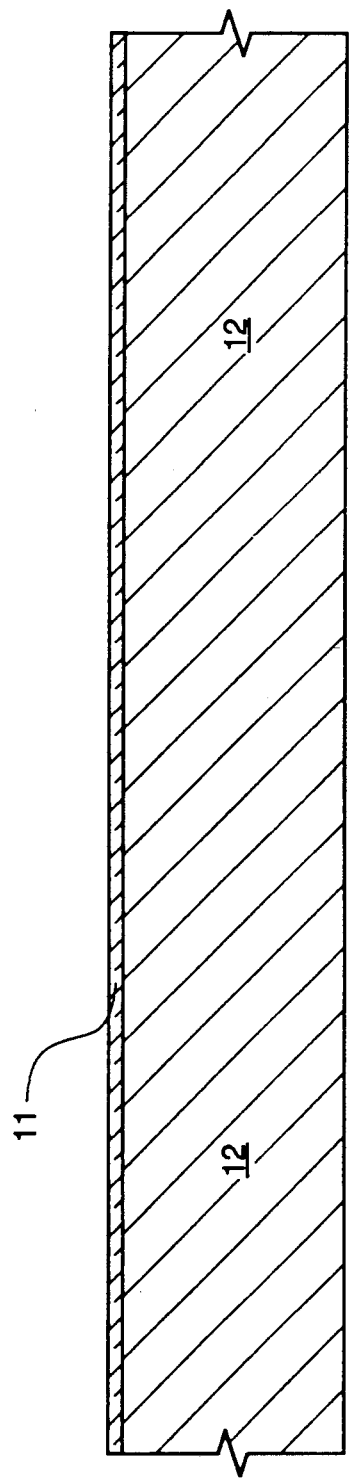
FIG. 1 is a cross-sectional view of a silicon substrate, on which has been thermally grown a first gate oxide layer.

Referring now to FIG. 1, a first silicon dioxide layer 11 is thermally grown on the upper surface of a silicon substrate 12 to a thickness that is somewhat less than the thickness desired for the fabrication of cell access transistors within a DRAM array (a second silicon dioxide layer will later be thermally grown with remnants of the first layer exposed, thus causing the thickness of the first silicon dioxide layer remnants to increase).

Figure 2:
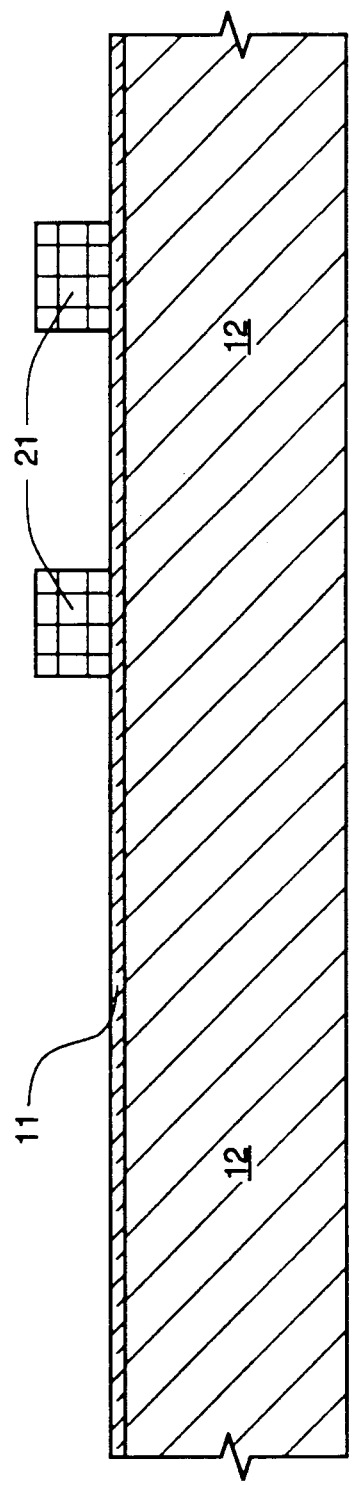
FIG. 2 is a cross-sectional view of the oxidized substrate of FIG. 1, following the masking thereof with a first photoresist mask in regions where cell access transistors are to be ultimately constructed.

Referring now to FIG. 2, first silicon dioxide layer 11 has been masked with a first photoresist mask 21 in regions where cell access transistors will ultimately be constructed.

Figure 3:
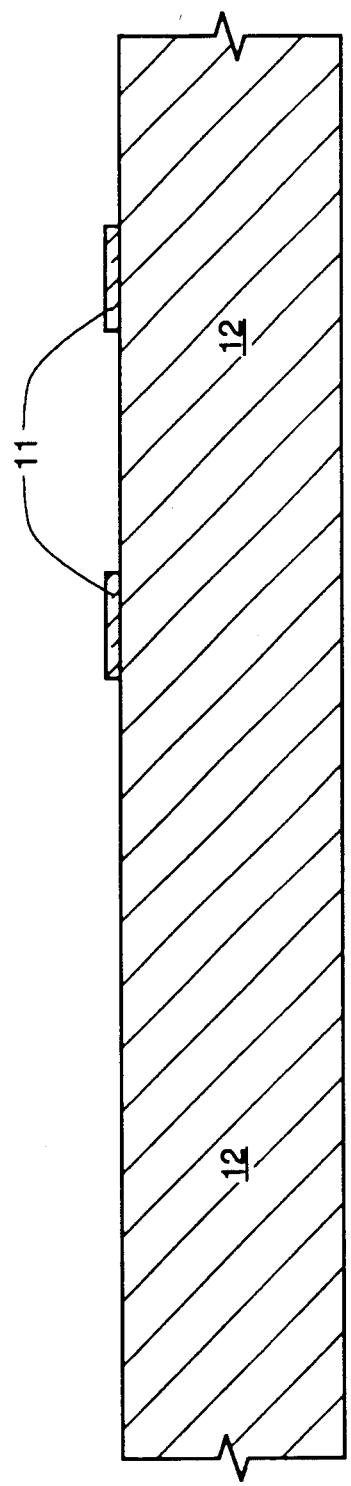
FIG. 3 is a cross-sectional view of the oxidized substrate of FIG. 2, following removal of those portions of the first gate oxide layer that were not subjacent the photoresist with a first oxide etch, and subsequent stripping of the first photoresist mask.

Referring now to FIG. 3, following a first oxide etch, which removed those portions of the first silicon dioxide layer 11 that were not subjacent first photoresist mask 21, first photoresist mask 21 is stripped.

Figure 4:
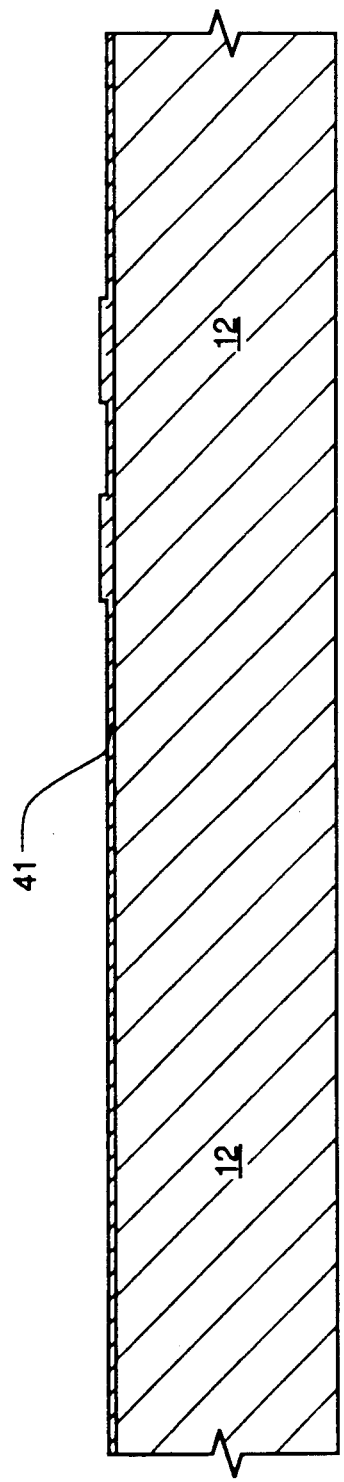
FIG. 4 is a cross-sectional view of the substrate of FIG. 3, following the thermal growth of a second gate oxide layer.

Referring now to FIG. 4, with remnants of first silicon dioxide layer 11 remaining on the surface of substrate 12, a second silicon dioxide layer 41 is grown on the exposed upper surface of substrate 12. A certain amount of oxygen penetrates the remnants of silicon dioxide layer 11, causing there to increase in thickness. Oxide growth begins rapidly as exposed silicon is converted almost instantaneously to silicon dioxide. However, as the oxidation reaction proceeds, the existing oxide acts as an oxygen diffusion barrier, thus slowing the reaction as the oxide layer increases in thickness.

Figure 5:
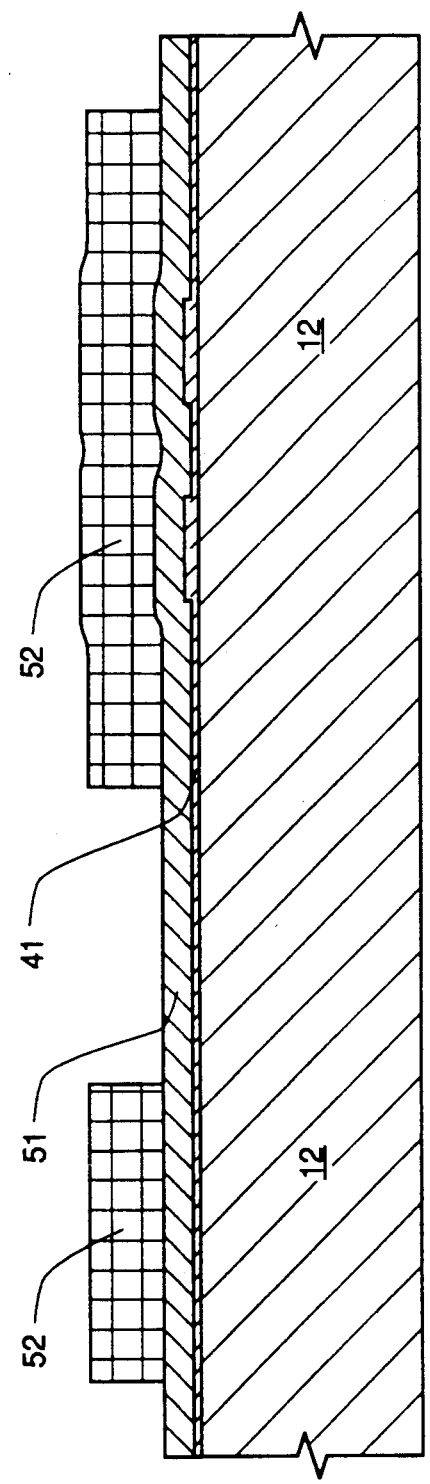
FIG. 5 is a cross-sectional view of the oxidized substrate of FIG. 4, following the deposition of a silicon nitride layer, and masking of the silicon nitride layer with a second photoresist mask in regions which will become future active areas.

Referring now to FIG. 5, a conventional Local Oxidation Of Silicon (LOCOS) step begins with the blanket deposition of a silicon nitride layer 51 on top of first and second silicon dioxide layers (11 and 41, respectively), and masking of silicon nitride layer 51 with a second photoresist mask 52 in regions that will become active areas with the DRAM circuitry.

Figure 6:
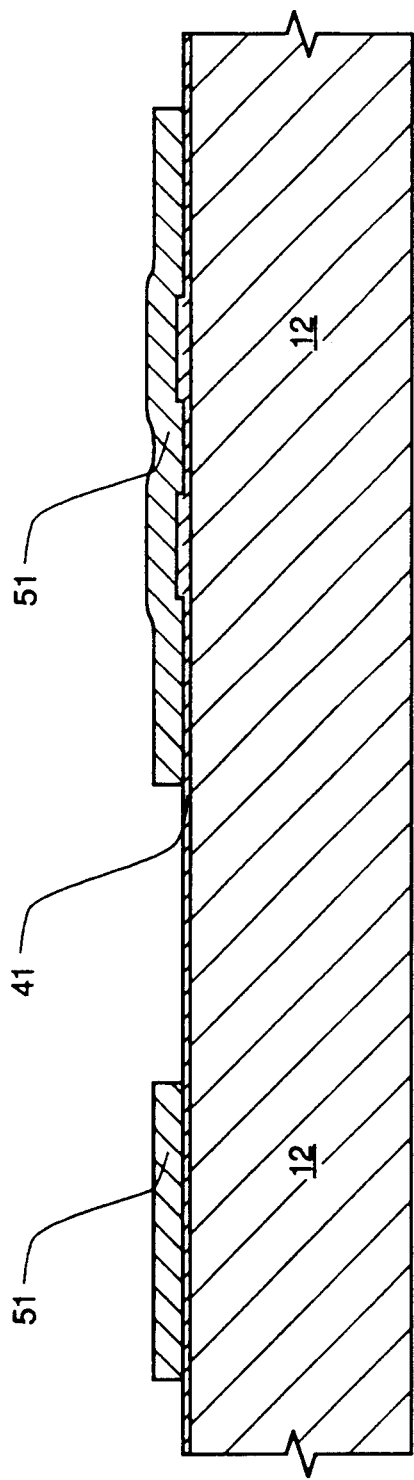
FIG. 6 is a cross-sectional view of the substrate of FIG. 5, following the removal of those portions of the silicon nitride layer that were not subjacent the second photoresist mask.

Referring now to FIG. 6, those portions of silicon nitride layer 51 that were not subjacent second photoresist mask 52 were removed with a first nitride etch, and second photoresist mask 52 has been removed.

Figure 7:
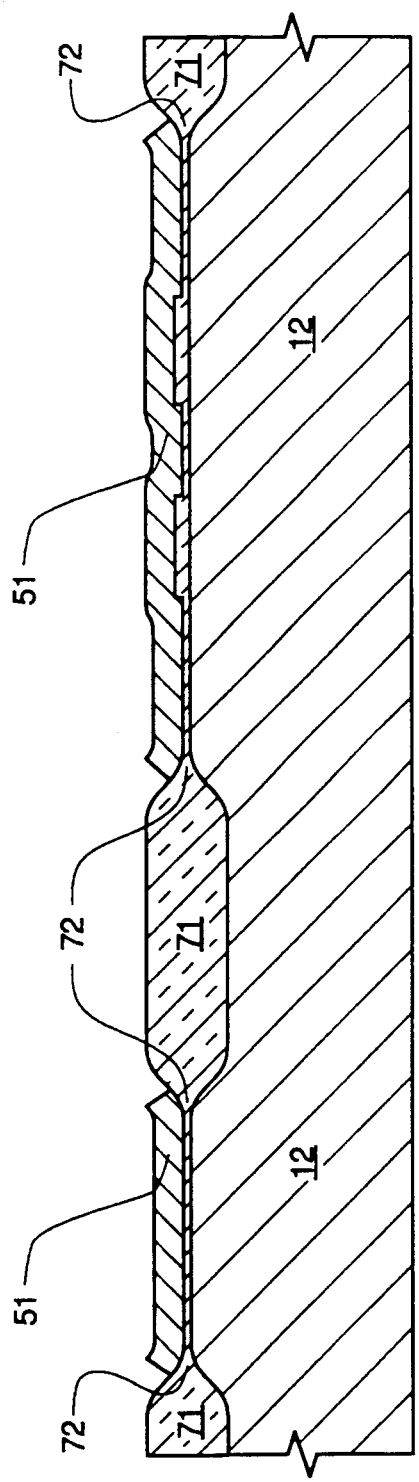
FIG. 7 is a cross-sectional view of the substrate of FIG. 6, following the creation of field oxide regions with thermal oxidation.

Referring now to FIG. 7, substrate 12 is thermally oxidized to create field oxide regions 71. The remnants of silicon nitride layer 51 protect subjacent regions of substrate 12 from further oxidation, except in bird's beak regions 72 at the edges of the remnants of silicon nitride layer 51, where oxidative encroachment is unavoidable. It should be noted that during the growth of field oxide regions 71, first and second silicon dioxide layers (11 and 41, respectively) functioned as a single pad oxide layer which acted as a buffer to relieve stress generated between substrate 12 and the remanants of silicon nitride layer 51.

Figure 8:
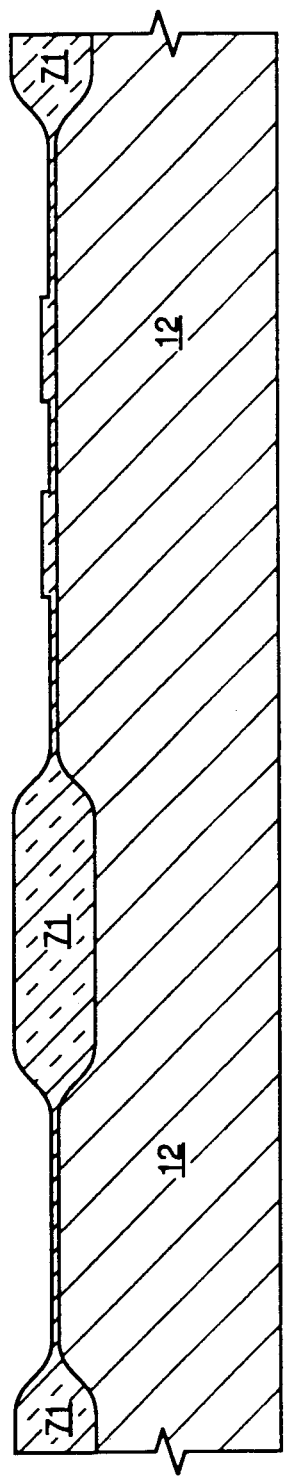
FIG. 8 is a cross-sectional view of the substrate of FIG. 7, following the removal of the silicon nitride layer remnants.

Referring now to FIG. 8, the remnants of silicon nitride layer 51 have been removed with a second nitride etch. Fabrication of field effect transistor gates may now proceed. The remainder of the DRAM fabrication process is conventional, and will not be described in detail. The gates will be patterned from a conductive layer (whether plain doped polycrystalline silicon, or doped or undoped polycrystalline silicon that has been silicided to lower sheet resistance).

Figure 9:
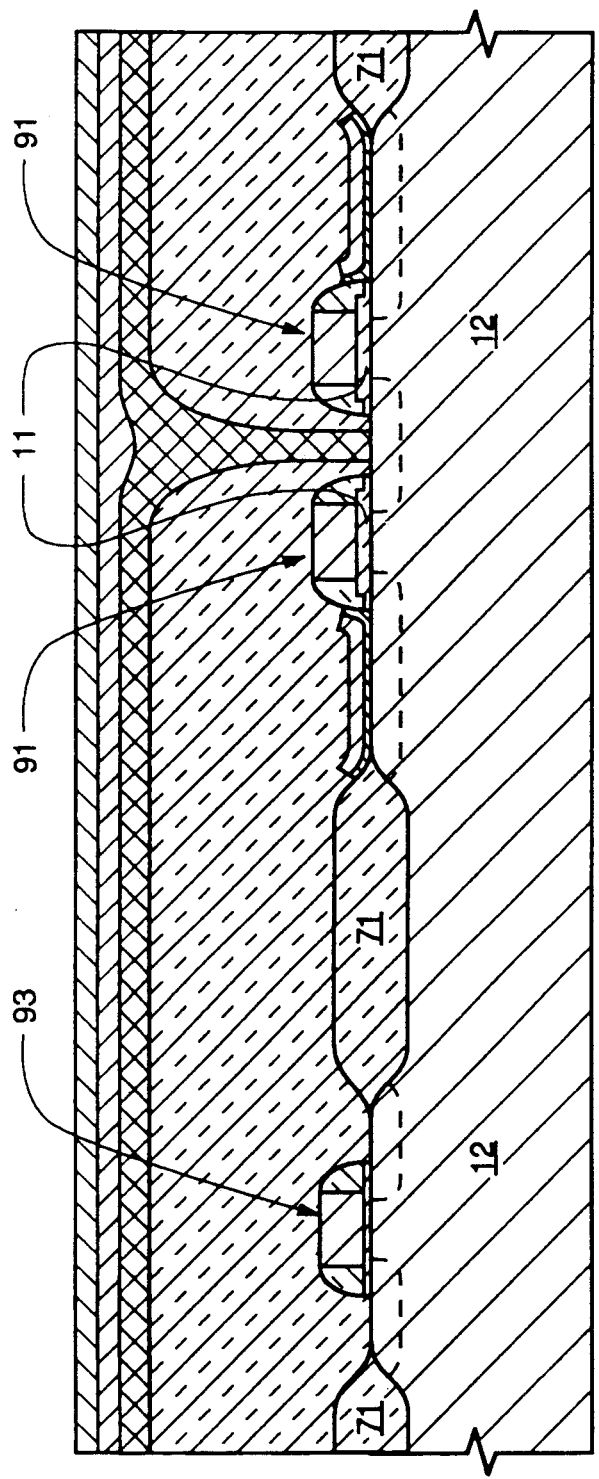
FIG. 9 is a cross-sectional view of the oxidized substrate of FIG. 8, following the fabrication of a pair of DRAM cell access transistor gates on top of the first gate oxide layer remnants and a peripheral driver transistor gate on top of a portion of the second gate oxide layer.

Referring now to FIG. 9, a pair of DRAM cell access transistor gates 91 have been fabricated on top of the remnants of first silicon dioxide layer 11 in the right active area, while a peripheral driver transistor gate 93 has been constructed on the thinner second silicon dioxide layer 41 in the left active area 92. It should be noted that in this instance, remnants of first and second silicon dioxide layers (11 and 41, respectively) are functioning as gate oxide layers.

Although only a single embodiment of the process for creating two thickness of gate oxide within a DRAM memory, it will be apparent to one skilled in the art that changes and modifications may be made thereto without departing from the spirit and the scope of the invention as claimed.

We claim:

1. A process for creating dynamic random access memory circuitry on a silicon substrate, said circuitry having a first gate oxide layer, on top of which cell access transistor gates are fabricated, and a second gate oxide layer that is thinner than said first gate oxide layer, on top of which peripheral row line driver transistor gates are fabricated, said process comprising the following steps:

(a) thermal oxidation of the substrate to create a first gate oxide layer on the upper surface of the substrate;

(b) masking the first gate oxide layer with a first photoresist mask in regions where cell access transistors will ultimately be constructed;

(c) removal of those portions of the first gate oxide layer that are not subjacent the first photoresist mask with a first oxide etch, thus exposing unoxidized regions of the silicon substrate;

(d) stripping the first photoresist mask;

(e) thermal growth of a second gate oxide layer in the unoxidized regions of the upper surface of the substrate;

(f) blanket deposition of a silicon nitride layer on top of first and second gate oxide layers;

(g) masking of the silicon nitride layer with a second photoresist mask in regions which will become future active areas;

(h) removal of those portions of the silicon nitride layer that were not subjacent the second photoresist mask with a first nitride etch;

(i) stripping of the second photoresist mask;

(j) creation of field oxide regions by the thermally oxidizing regions of the upper surface of the substrate which are not covered by remnants of the silicon nitride layer;

(k) removal of remnants of the silicon nitride layer with a second nitride etch; and (l) creation of DRAM cell access transistor gates on top of the first gate oxide layer remnants and creations of peripheral driver transistor gates on top of the second gate oxide layer remnants.

2. A process for creating a dynamic random access memory fabricated on a silicon substrate, consisting of a process for creating a dual-function silicon dioxide layer having first and second thicknesses, said first thickness being greater than said second thickness, said dual-function silicon dioxide layer being initially used for a stress-relief layer between the substrate and a silicon nitride layering during a LOCOS step creating field oxide regions, and subsequently used for gate oxide, constructing cell access transistor gates on top portions of said dual-function silicon dioxide layer of said first thickness, and constructing peripheral row line drive transistor gates on top portions of said dual-function silicon dioxide layer of said second thickness.

3. A process for creating a dynamic random access memory as described in claim 2 wherein the process for creating and constructing comprises the following steps:

(a) thermal oxidation of the substrate to create a first silicon dioxide layer on the upper surface of the substrate;

(b) masking the first gate oxide layer with a first photoresist mask in regions where cell access transistors will ultimately be constructed;

(c) removal of those portions of the first silicon dioxide layer that are not subjacent the first photoresist mask with a first oxide etch, thus exposing unoxidized regions of the silicon substrate;

(d) stripping the first photoresist mask;

(e) thermal growth of a second silicon dioxide layer in the unoxidized regions of the upper surface of the substrate;

(f) blanket deposition of a silicon nitride layer on top of first and second gate oxide layers;

(g) masking of the silicon nitride layer with a second photoresist mask in regions which will become future active areas;

(h) removal of those portions of the silicon nitride layer that were not subjacent the second photoresist mask with a first nitride etch;

(i) stripping of the second photoresist mask;

(j) creation of field oxide regions by the thermally oxidizing regions of the upper surface of the substrate which are not covered by remnants of the silicon nitride layer;

(k) removal of remnants of the silicon nitride layer with a second nitride etch; and (l) creation of DRAM cell access transistor gates on top of portions of the first silicon dioxide layer and creation of peripheral driver transistor gates on top of portions of the second silicon dioxide layer.

* * * * *

UNITED STATES PATENT AND TRADEMARK OFFICE
CERTIFICATE OF CORRECTION

PATENT NO. : 5,057,449

DATED : October 15, 1991

INVENTOR(S) : Tyler A. Lowrey et al.

It is certified that error appears in the above-indentified patent and that said Letters Patent is hereby corrected as shown below:

In the Abstract, line 12, delete "construction" and insert -- constructed --.

Column 5, line 22, delete "layering" and insert -- layer --.

Signed and Sealed this

Fourth Day of January, 1994

Attest:

BRUCE LEHMAN

*Attesting Officer*          *Commissioner of Patents and Trademarks*